United States Patent [19]
Kellogg et al.

[11] Patent Number: 5,896,404
[45] Date of Patent: Apr. 20, 1999

[54] PROGRAMMABLE BURST LENGTH DRAM

[75] Inventors: Mark W. Kellogg, Essex Junction; Timothy J. Dell, Colchester; Erik L. Hedberg, Essex Junction; Claude L. Bertin, South Burlington, all of Vt.

[73] Assignee: International Business Machines Corporation, Armonk, N.Y.

[21] Appl. No.: 08/833,371

[22] Filed: Apr. 4, 1997

[51] Int. Cl.[6] .................................................. G11C 29/00
[52] U.S. Cl. ........................... 371/40.11; 371/40.14; 371/40.17; 371/40.4; 371/40.2; 395/182.04; 395/182.06
[58] Field of Search ................. 371/40.11, 40.2, 371/49.1, 37.8, 40.4, 48, 37.7, 40.18, 40.14, 37.4, 10.2, 10.3, 40.17; 365/230.03, 230.06, 200, 207; 395/182.04, 182.06

[56] References Cited

U.S. PATENT DOCUMENTS

| | | | |
|---|---|---|---|
| 4,527,251 | 7/1985 | Nibby, Jr. et al. | 395/182.06 |
| 4,612,640 | 9/1986 | Mehrotra et al. | 371/40.4 |
| 5,014,187 | 5/1991 | Debize et al. | 395/886 |
| 5,109,521 | 4/1992 | Culley | 711/165 |
| 5,261,064 | 11/1993 | Wyland | 711/211 |
| 5,278,964 | 1/1994 | Mathews et al. | 711/3 |
| 5,293,593 | 3/1994 | Hodge et al. | 711/202 |
| 5,386,540 | 1/1995 | Young et al. | 711/144 |
| 5,410,512 | 4/1995 | Takase et al. | 365/230.03 |
| 5,537,573 | 7/1996 | Ware et al. | 711/137 |
| 5,638,334 | 6/1997 | Farmwald et al. | 365/230.03 |

*Primary Examiner*—Reba I. Elmore
*Assistant Examiner*—McDieunel Marc
*Attorney, Agent, or Firm*—Whitham, Curtis, Whitham; Robert A. Walsh

[57] ABSTRACT

A Dynamic Random Access Memory (DRAM) with a burst length programmable as eight (8) or nine (9) bytes. The DRAM array is divided into two or more sub-arrays, with sub-array cells arranged in addressable rows and columns. When the DRAM is programmed in Normal mode, the burst length is 8 and the entire array address space is available for data storage. When the DRAM is programmed for error checking (ECC mode), the burst length is nine and the array is reconfigured with part of the array providing the ninth byte. The DRAM's address space is reduced by one-eighth in ECC mode. Preferably, all nine locations are in the same page, with each page being divided into eight equal portions. In Normal mode all eight equal portions are data storage; and, in ECC mode, seven-eighths of the page is data storage, the remaining one eighth being assigned to check bit storage.

9 Claims, 4 Drawing Sheets

PROGRAMMABLE BURST LENGTH DRAM

CROSS REFERENCE TO RELATED APPLICATION

The Present invention is related to application Ser. No. 08/833,367 (Attorney Reference No. BU9-97-028) entitled "Reconfigurable I/O DRAM" to Bertin et al., assigned to the assignee of the present invention and filed concurrently herewith.

BACKGROUND OF THE INVENTION

Field of the Invention

The present invention generally relates to high performance Dynamic Random Access Memories (DRAMs) and, in particular, to high bandwidth DRAMs that may be used in Error Checking applications.

Background Description

Memory performance is a well known limitation to computer system performance. Ideally, the memory performance would match or exceed processor performance, i.e., a memory cycle time would be less than one processor clock cycle. This is almost never the case and, so, the memory is a system bottleneck. A state of the art high speed microprocessor may run on a 200 MegaHertz (MHZ) clock with a five nanosecond (ns) clock period. A high performance DRAM may have a 60 ns access time, which falls far short of processor performance.

This system bottleneck is exacerbated by the rise in popularity of multimedia applications. Multimedia applications demand several times more bandwidth for main memory or frame-buffer memory than computational intensive tasks; tasks such as spread sheet analysis programs or other Input/Output (I/O) intensive applications such as word processing or printing.

Extended Data Out (EDO) and Synchronous DRAMs (SDRAMs) were developed to improve bandwidth. However, SDRAMs and EDO RAMs still do not match processor performance and, therefore, still limit system performance. Consequently, as faster microprocessors are developed for multimedia processing and high performance systems, faster memory architecture is being developed to bridge the memory/processor performance gap, e.g., wide I/O DRAMs.

While the problem of matching memory speed to processor performance is being addressed, memory reliability in such a high performance system has not. Traditional Error Checking Code (ECC) schemes are not easily adapted to such a high performance memory chip organization. Typical ECC schemes include parity checking and Single Error Correction—Double Error Detection (SEC/DED) codes.

Parity is preferred for narrow data words, i.e., eight or sixteen bits because it requires only one extra bit per byte. However, parity only indicates that one or more bits in the byte/word is in error.

SEC/DED codes are more reliable than parity, but for short data words (one or two bytes) require several check bits per word, and are, therefore, seldom used in such applications. SEC/DED is more efficient for a wider data word, i.e., sixty-four bits or greater, because for a wider word (several bytes), the check bit/byte ratio may be reduced to less than one.

However, adding ECC to a memory system requires adding logic and extra memory chips for the six or more check bits. This extra memory may be in the form of extra memory chips or, special memory chips with nine or eighteen data I/O.

Thus, there is a need for DRAM chips that lend themselves to ECC applications for high bandwidth memory architectures.

Objects of the Invention

It is therefore an object of the present invention to improve high performance memory system reliability.

It is another object of the present invention to eliminate the need for extra synchronous memory chips for parity or check bits in high performance memory systems with error checking capability.

SUMMARY OF THE INVENTION

The present invention is a high bandwidth Dynamic Random Access Memory (DRAM) with a programmable burst length of eight or nine. The DRAM array is divided into two or more banks, with sub-array cells arranged in addressable rows and columns. When the DRAM is programmed for an eight location burst, the entire address space is available for data storage. When the DRAM is programmed for a nine bit burst, part of each sub-array is reallocated as the ninth bit with the DRAM's address space reduced by one-eighth. Eight locations are in seven-eighths of the sub-array and the ninth location is from the remaining one eighth sub-array.

In the preferred embodiment all nine locations are in the same page, with each page being divided into eight equal portions. In Normal mode all eight locations are data storage locations; In ECC mode, seven-eights of the page is data storage, the remaining one eighth, is assigned to check bit storage.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF A PREFERRED EMBODIMENT

Figure 1:
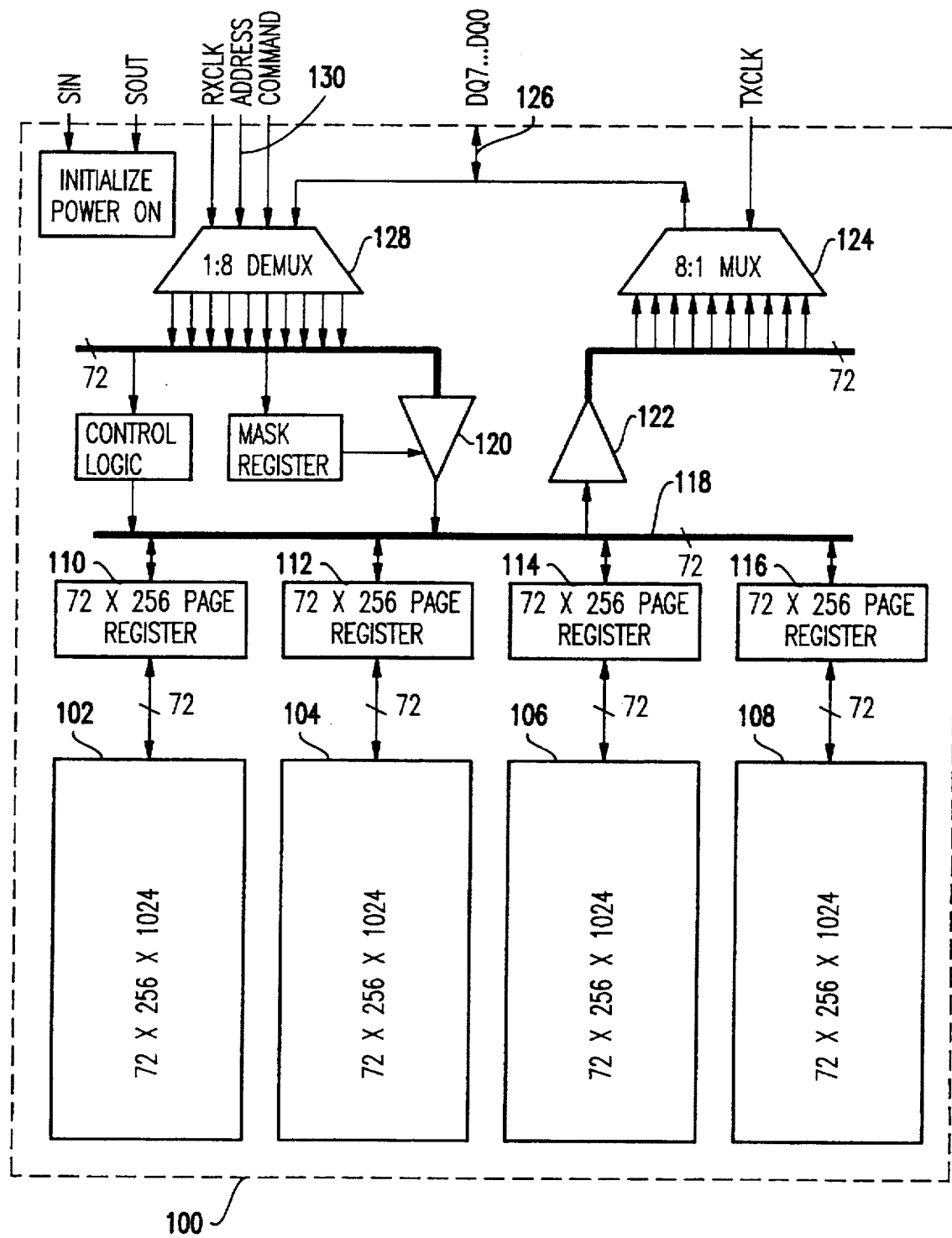
FIG. 1 is a block diagram of a typical seventy-two Megabit (Mb) high bandwidth memory chip 100.

FIG. 1 is a block diagram of a typical 72 Mb high bandwidth memory chip 100 adapted for by nine (×9) operation. The memory array of this 72 Mb chip includes four 18 Mb banks 102, 104, 106 and 108. Each bank 102, 104, 106 and 108 is buffered by a page register 110, 112, 114, or 116, respectively. Data to/from the page registers 110, 112, 114 and 116 is transferred on a seventy-two bit data bus 118 from drivers 120 or to buffers 122. Buffers 122 pass data from the seventy-two bit data bus 118 to an 8:1 multiplexer (mux) 124. One byte (9 bits) is selected by mux 124 and passed off chip 100 on I/Os 126. Data In from I/Os 126 is received by demultiplexer (demux) 128. Demux 128 places any received data at the appropriate nine inputs to drivers 120 in response to a previously received address. Address input enable 130 places all I/O drivers in their high impedance state, so that an address may be received on the I/Os 126.

Figure 2:
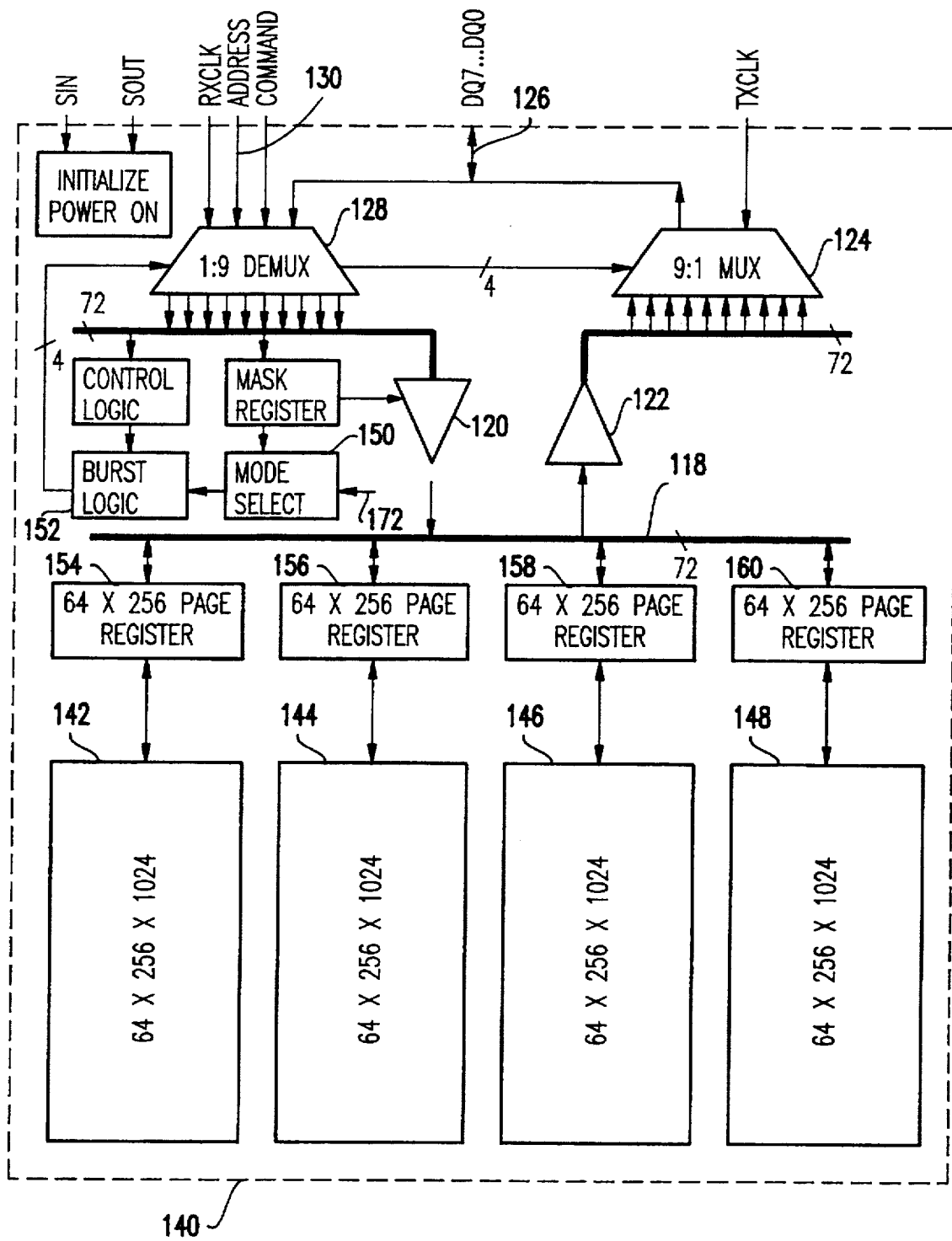
FIG. 2 is a schematic of a preferred embodiment DRAM chip.

FIG. 2 is a schematic of a preferred embodiment high bandwidth/performance DRAM according to the present invention. In its normal mode of operation (Normal mode) the chip 140 is programmed for a burst length of eight. In ECC mode, the chip 140 is programmed for a burst length of nine, where the chip's address space is reduced by one-eighth.

In the example of FIG. 2, the chip 140 is a 64 Mb array of four 16 Mb sub-arrays 142, 144, 146 and 148. It is understood that although the present invention is described in terms of a 64 Mb chip, the organization and density are for example only and, not intended as a limitation. The chip may be, for example, 256 Mb, one Gigabit (Gb) or larger with its array in correspondingly larger sub-arrays or in more sub-arrays. It is also understood that the selection of a burst length of eight or nine locations for chip 140 is by way of example only. The Normal mode burst length may be any multiple of two, for example, sixteen, with ECC mode increasing the burst one or more additional locations.

Furthermore, elements of chip 140 in FIG. 2 that are identical or, substantially identical, to corresponding elements of the chip 100 in FIG. 1 with substantially identical operation are labeled identically.

In Normal mode, data is transferred to/from the page registers 154, 156, 158 or 160 as a 16 Kb block (one page) of data from a corresponding sub-array 142, 144, 146 or 148. One selected page register 154, 156, 158, 160 transfers sixty-four bits of data to/from Seventy-Two Bit Bus 118. Eight bits of Seventy-Two Bit Bus 118 are ignored ("don't care"). This sixty-four bits at the Seventy-Two Bit Bus 118 is transferred off chip as eight locations in a burst transfer.

In ECC mode, the page registers 154, 156, 158 and 160 are reconfigured to transfer seventy-two bits of data to/from seventy-two bit bus 118. As in the 72 Mb chip 100 of FIG. 1, data passes to/from seventy-two bit data bus 118 from drivers 120 or to buffers 122. However, instead of transferring eight locations of nine bits each from one page, in an ECC mode burst transfer, this seventy-two bits is transferred in a burst of nine eight bit locations, eight locations from one sub-page and the ninth from another sub-page.

Selecting Normal mode or ECC mode in the Mode Select Circuit 150 selects the number of burst locations in the Burst Logic 152 (described in detail herein below) and also affects operation of the page registers 154, 156, 158 and 160. The mode set by metal mask programmability wirebond Mode Select Logic 150 includes a "power on reset" state to insure that the DRAM enters Normal mode on memory power up and remains in Normal mode unless directed otherwise.

Figure 3:
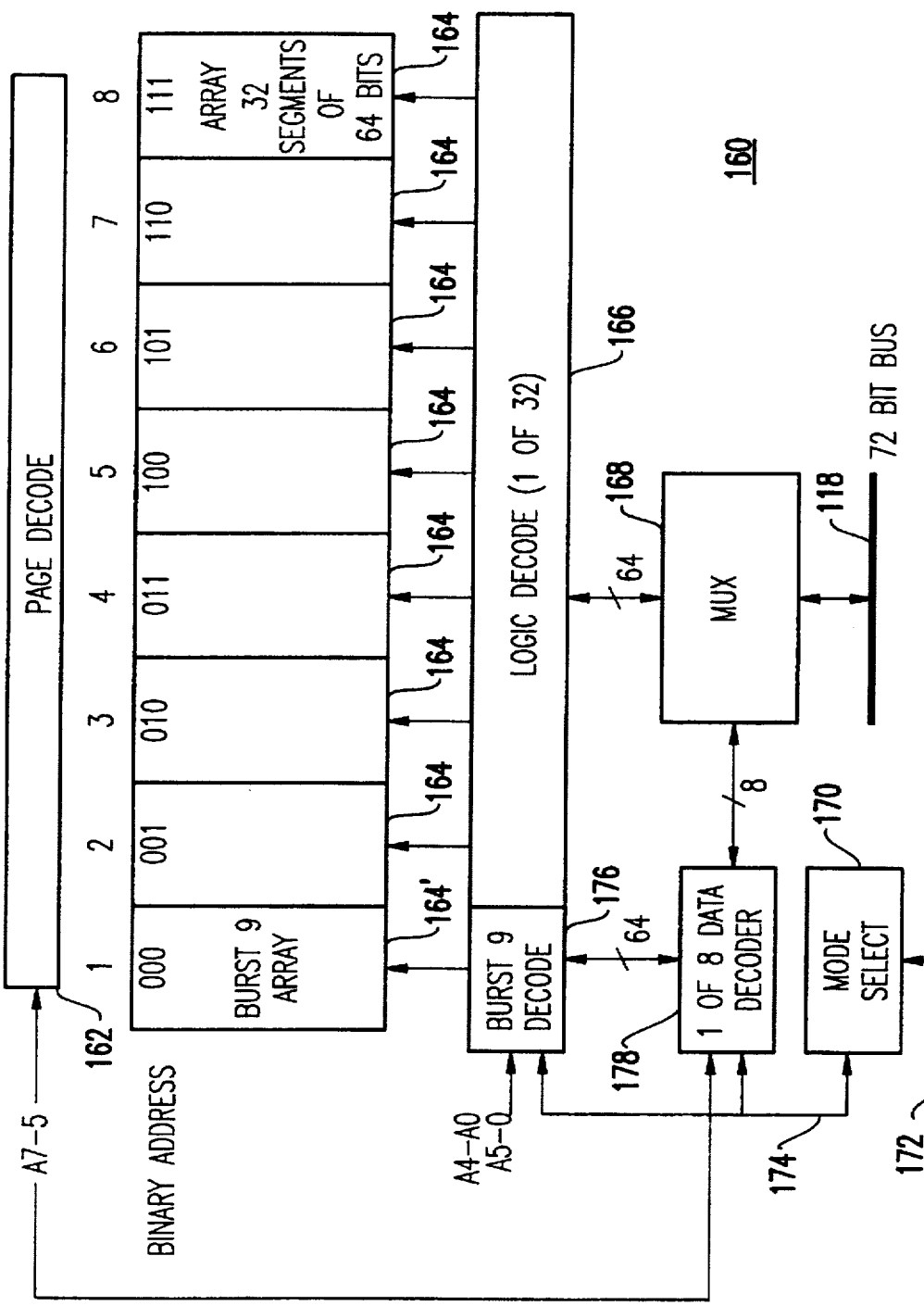
FIG. 3 is a block diagram of a page register as in the preferred embodiment chip of FIG. 2.

FIG. 3 is a block diagram of a preferred embodiment page register 160, typical of page registers 154, 156, 158 and 160 in FIG. 2. Page register 160 includes a page decoder 162 for selecting one of eight 2 Kb registers or, sub-page arrays 164. Each sub-page array 164 is organized as thirty-two 64-bit segments.

In the page register 160, chip I/O organization is set in Mode Select block 170 by programming a fuse, setting a bit in a mode register or, any equivalent method. Alternatively, the mode may be set permanently by metal mask programming or by wire bond selection. The selection input to Mode Select Block 170 is connected at input 172.

In Normal mode, Page Decode 162 selects one of the eight sub-page arrays 164. Logic Decode 166 selects one of the thirty-two segments in the selected sub-page array 164. The selected segment is passed to/from multiplexer (mux) 168. Mux 168 is essentially two banks of gatable transceivers (not shown), a sixty-four bit bank and an eight bit bank. In normal mode the eight bit bank is disabled, i.e., gated off. So, the selected sixty-four bit segment is coupled to/from seventy-two bit bus 118 by mux 168. As described above, in normal mode eight bits of the data path between seventy-two bit data bus 118 and data I/O's 126 are ignored.

In ECC mode, the sixty-four bit segment is selected from seven sub-arrays 164 as described above for Normal mode. However, sub-page array 164', for example, is pre-designated as the check bit portion of the array. Any sub-page array 164 or any number of sub-page arrays 164 may be designated as check bit array(s).

In ECC mode, check bit selection operates in parallel with data selection. The output 174 of Mode Select block 170 isolates and enables sub-page decode 176 of logic decode 166 and enables 1:8 Decoder 178. Sub-page decode 176 selects one sixty-four bit segment and 1:8 Decode 178 selects one byte of the selected segment.

The eight bit bank of mux 168 is enabled in ECC mode. So, the selected byte is passed to/from mux 168 in parallel with the selected sixty-four bit data segment. Mux 168 merges/selects the selected byte, i.e., the check bits, with the selected data segment. The resulting seventy-two bit segment (sixty-four data bits and eight check bits) are coupled to/from seventy-two bit bus 118. Data transfers between the seventy-two bit bus 118 and the eight Data I/Os 126 as controlled by the Burst Logic 152.

Figure 4:
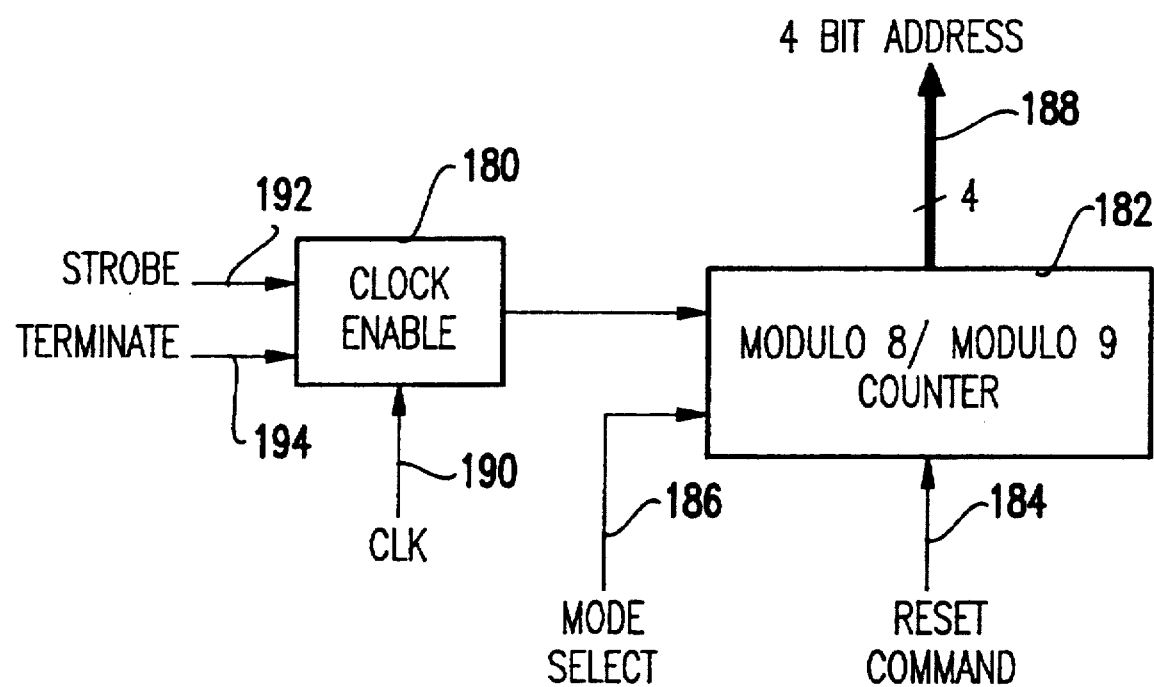
FIG. 4 is a schematic of Burst Logic for controlling a burst transfer in a preferred embodiment DRAM.

FIG. 4 is a schematic of Burst Logic 152 in FIG. 2. The Burst Logic 152 includes a Clock buffer 180 and a Selectable Counter 182 that may be selected as a modulo eight counter or a modulo nine counter.

On power up, Reset Command 184 resets the Selectable Counter 182 and forces the "Rest Condition". In Normal mode the Mode Select line 186 from Mode Select logic 150 sets the Selectable Counter 182 as a modulo eight counter. In ECC mode the Mode Select line 186 sets the Selectable Counter 182 as a modulo nine counter. The counter's four bit output 188 is passed both to 9:1 output mux 124 and 9:1 input mux 128, gating data to/from I/Os 126 as fast as the Selectable Counter 182 is toggled. Burst rate is set by clock 190 as gated by Strobe 192 and Terminate 194 in Clock Buffer 180.

Thus, the preferred embodiment provides a flexible DRAM that may be used for applications where error checking is required or for in simple unchecked memory applications.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A Dynamic Random Access Memory (DRAM) comprising:

an array of memory cells arranged in addressable rows and columns, said memory cells being grouped into groups;

accessing means for accessing each of said groups, wherein a block of said groups are accessed sequentially at a block address within a page;

selection means for selecting an organization state as being either Normal mode or ECC mode, each of said blocks including a first number of groups in Normal mode and paired with a second number of groups in ECC mode under said block address; and means for selectively dividing said array into an ECC portion and a data portion whenever said organization state is said ECC mode, wherein in ECC mode each said block includes at least one group from said ECC portion and one or more groups from said data portion, all said groups in said block being from said page.

2. The DRAM of claim 1 wherein fewer blocks are available in ECC mode than in Normal mode.

3. The DRAM of claim 2 wherein the array is at least two sub-arrays and, the accessing means comprises a page register at each said sub-array, each said page register including enough register locations to store one page of sub-array memory cells.

4. The DRAM of claim 3 wherein the means for selectively dividing the array divides each of said at least two sub-arrays into an ECC portion and a data portion, groups in the ECC portion of each said sub-array being paired with groups in the data portion of said sub-array.

5. The DRAM of claim 4 wherein the groups are 8 bit groups, each said block including 8 groups in Normal mode and 9 groups in ECC mode.

6. The DRAM of claim 5 having one-eighth fewer blocks in ECC mode than in Normal mode.

7. A DRAM comprising:

an array of memory cells arranged in two or more sub-arrays of memory cells, said memory cells in said sub-arrays arranged in addressable rows and columns;

accessing means for sequentially accessing groups of said memory cells responsive to a block address within a page;

selection means for selecting an organization state as being either Normal mode or ECC mode, said accessing means being responsive to fewer block addresses in ECC mode than in Normal mode; and means for selectively dividing each of said sub-arrays into an ECC portion and a data portion whenever said organization state is said ECC mode, groups in said ECC portion being paired with a plurality of groups in said data portion, wherein each said block includes said at least one ECC group and its corresponding plurality of groups in said data portion, all said groups in said block being from said page.

8. The DRAM of claim 7 wherein each said block of groups is 8 groups in Normal mode and each said block of groups is 9 groups in ECC mode.

9. The DRAM of claim 8 having one-eighth fewer block addresses in ECC mode than in Normal mode.

* * * * *